(12) United States Patent
Flannery, Jr.

(10) Patent No.: US 8,993,362 B1
(45) Date of Patent: Mar. 31, 2015

(54) OXIDE RETAINER METHOD FOR MEMS DEVICES

(75) Inventor: Anthony F. Flannery, Jr., Los Gatos, CA (US)

(73) Assignee: mCube Inc., San Jose, CA (US)

( * ) Notice: Subject to any disclaimer, the term of this patent is extended or adjusted under 35 U.S.C. 154(b) by 549 days.

(21) Appl. No.: 13/189,471

(22) Filed: Jul. 22, 2011

Related U.S. Application Data

(60) Provisional application No. 61/367,032, filed on Jul. 23, 2010.

(51) Int. Cl.
*H01L 21/00* (2006.01)

(52) U.S. Cl.
USPC ........... 438/53; 438/26; 438/51; 257/E21.214

(58) Field of Classification Search
CPC .................. H01L 27/14689; H01L 27/14609; H01L 2924/01079; G01P 15/0802; G01P 15/125; B81C 1/00333; G01L 9/0042
USPC ............. 438/26, 48, 50, 51, 53; 257/E21.214
See application file for complete search history.

(56) References Cited

U.S. PATENT DOCUMENTS

| | | | |
|---|---|---|---|
| 3,614,677 A | 10/1971 | Wilfinger | |
| 4,954,698 A | 9/1990 | Yasunaga et al. | |
| 5,140,745 A | 8/1992 | McKenzie | |
| 5,157,841 A | 10/1992 | Dinsmore | |
| 5,173,597 A | 12/1992 | Anglin | |
| 5,493,769 A | 2/1996 | Sakai et al. | |
| 5,610,414 A | 3/1997 | Yoneda et al. | |
| 5,668,033 A | 9/1997 | Ohara | |
| 5,729,074 A | 3/1998 | Shiomi et al. | |
| 6,046,409 A | 4/2000 | Ishii et al. | |
| 6,076,731 A | 6/2000 | Terrell | |
| 6,115,261 A | 9/2000 | Platt et al. | |
| 6,188,322 B1 | 2/2001 | Yao | |
| 6,263,736 B1 | 7/2001 | Thundat et al. | |
| 6,278,178 B1 | 8/2001 | Kwon et al. | |
| 6,480,699 B1 | 11/2002 | Lovoi | |
| 6,483,172 B1 | 11/2002 | Cote | |
| 6,485,273 B1 | 11/2002 | Goodwin-Johansson | |
| 6,534,726 B1 | 3/2003 | Okada et al. | |
| 6,753,664 B2 | 6/2004 | Neufeld et al. | |
| 6,855,572 B2 | 2/2005 | Jeun et al. | |
| 6,912,336 B2 | 6/2005 | Ishii | |
| 6,933,165 B2 | 8/2005 | Musolf et al. | |
| 6,979,872 B2 | 12/2005 | Borwick | |
| 7,019,434 B2 | 3/2006 | Helmbrecht | |
| 7,095,226 B2 | 8/2006 | Wan et al. | |

(Continued)

*Primary Examiner* — Jack Chen
(74) *Attorney, Agent, or Firm* — Kilpatrick Townsend & Stockton LLP

(57) ABSTRACT

A method and structure for fabricating a monolithic integrated MEMS device. The method includes providing a substrate having a surface region and forming at least one conduction material and at least one insulation material overlying at least one portion of the surface region. At least one support structure can be formed overlying at least one portion of the conduction and insulation surface regions, and at least one MEMS device can be formed overlying the support structure(s) and the conduction and insulation surface regions. In a variety of embodiments, the support structure(s) can include dielectric or oxide materials. The support structure(s) can then be removed and a cover material can be formed overlying the MEMS device(s), the conduction and insulation materials, and the substrate. In various embodiments, the removal of the support structure(s) can be accomplished via a vapor etching process.

20 Claims, 5 Drawing Sheets

(56) References Cited

U.S. PATENT DOCUMENTS

| | | | |
|---|---|---|---|
| 7,145,555 B2 | 12/2006 | Taylor et al. | |
| 7,153,717 B2 * | 12/2006 | Carley et al. | 438/55 |
| 7,183,630 B1 | 2/2007 | Fogelson et al. | |
| 7,195,945 B1 | 3/2007 | Edelstein et al. | |
| 7,239,000 B2 | 7/2007 | Witcraft | |
| 7,253,079 B2 | 8/2007 | Hanson et al. | |
| 7,258,009 B2 | 8/2007 | Imai | |
| 7,370,530 B2 | 5/2008 | DCamp et al. | |
| 7,391,091 B2 | 6/2008 | Tondra | |
| 7,402,449 B2 | 7/2008 | Fukuda et al. | |
| 7,430,674 B2 | 9/2008 | Van Mueller et al. | |
| 7,453,269 B2 | 11/2008 | Won et al. | |
| 7,454,705 B2 | 11/2008 | Cadez et al. | |
| 7,456,042 B2 | 11/2008 | Stark | |
| 7,493,496 B2 | 2/2009 | Smith et al. | |
| 7,498,715 B2 | 3/2009 | Yang | |
| 7,511,379 B1 | 3/2009 | Flint | |
| 7,521,783 B2 | 4/2009 | Tsai et al. | |
| 7,536,909 B2 | 5/2009 | Zhao et al. | |
| 7,676,340 B2 | 3/2010 | Yasui | |
| 7,690,255 B2 | 4/2010 | Gogoi et al. | |
| 7,708,189 B1 | 5/2010 | Cipriano | |
| 7,713,785 B1 | 5/2010 | Flint | |
| 7,779,689 B2 | 8/2010 | Li et al. | |
| 7,814,791 B2 | 10/2010 | Andersson et al. | |
| 7,814,792 B2 | 10/2010 | Tateyama et al. | |
| 7,814,793 B2 | 10/2010 | Sato | |
| 7,861,422 B2 | 1/2011 | MacDonald | |
| 7,891,103 B2 | 2/2011 | Mayor | |
| 8,011,577 B2 | 9/2011 | Mullen et al. | |
| 8,016,191 B2 | 9/2011 | Bonalle et al. | |
| 8,025,365 B2 * | 9/2011 | McAvoy et al. | 347/54 |
| 8,037,758 B2 | 10/2011 | Sato | |
| 8,056,412 B2 | 11/2011 | Rutkiewicz et al. | |
| 8,061,049 B2 | 11/2011 | Mayor | |
| 8,070,055 B2 | 12/2011 | Block et al. | |
| 8,087,296 B2 | 1/2012 | Ueda et al. | |
| 8,148,808 B2 | 4/2012 | Braden et al. | |
| 8,165,323 B2 | 4/2012 | Zhou | |
| 8,181,874 B1 | 5/2012 | Wan et al. | |
| 8,227,285 B1 | 7/2012 | Yang | |
| 8,236,577 B1 | 8/2012 | Hsu | |
| 8,245,923 B1 | 8/2012 | Merrill et al. | |
| 8,250,921 B2 | 8/2012 | Nasiri et al. | |
| 8,259,311 B2 | 9/2012 | Petschko | |
| 8,324,047 B1 | 12/2012 | Yang | |
| 8,342,021 B2 | 1/2013 | Oshio | |
| 8,367,522 B1 | 2/2013 | Yang | |
| 8,395,252 B1 | 3/2013 | Yang | |
| 8,395,381 B2 * | 3/2013 | Lo et al. | 324/249 |
| 8,402,666 B1 | 3/2013 | Hsu et al. | |
| 8,407,905 B1 | 4/2013 | Hsu et al. | |
| 8,421,082 B1 | 4/2013 | Yang | |
| 8,476,084 B1 | 7/2013 | Yang et al. | |
| 8,476,129 B1 | 7/2013 | Jensen et al. | |
| 8,477,473 B1 | 7/2013 | Koury et al. | |
| 8,486,723 B1 | 7/2013 | Wan et al. | |
| 2001/0053565 A1 | 12/2001 | Khoury | |
| 2002/0072163 A1 | 6/2002 | Wong et al. | |
| 2002/0134837 A1 | 9/2002 | Kishon | |
| 2003/0058069 A1 | 3/2003 | Schwartz et al. | |
| 2003/0095115 A1 | 5/2003 | Brian et al. | |
| 2003/0184189 A1 | 10/2003 | Sinclair | |
| 2004/0002808 A1 | 1/2004 | Hashimoto et al. | |
| 2004/0016995 A1 | 1/2004 | Kuo et al. | |
| 2004/0017644 A1 | 1/2004 | Goodwin-Johansson | |
| 2004/0056742 A1 | 3/2004 | Dabbaj | |
| 2004/0063325 A1 | 4/2004 | Urano et al. | |
| 2004/0104268 A1 | 6/2004 | Bailey | |
| 2004/0113246 A1 | 6/2004 | Boon | |
| 2004/0119836 A1 | 6/2004 | Kitaguchi et al. | |
| 2004/0140962 A1 | 7/2004 | Wang et al. | |
| 2004/0177045 A1 | 9/2004 | Brown | |
| 2004/0207035 A1 | 10/2004 | Witcraft et al. | |
| 2004/0227201 A1 | 11/2004 | Borwick et al. | |
| 2005/0074147 A1 | 4/2005 | Smith et al. | |
| 2005/0174338 A1 | 8/2005 | Ing | |
| 2005/0247787 A1 | 11/2005 | Von Mueller et al. | |
| 2006/0049826 A1 | 3/2006 | Daneman et al. | |
| 2006/0081954 A1 | 4/2006 | Tondra et al. | |
| 2006/0141786 A1 | 6/2006 | Boezen et al. | |
| 2006/0168832 A1 | 8/2006 | Yasui et al. | |
| 2006/0192465 A1 | 8/2006 | Kornbluh et al. | |
| 2006/0208326 A1 | 9/2006 | Nasiri et al. | |
| 2006/0211044 A1 | 9/2006 | Green | |
| 2006/0238621 A1 | 10/2006 | Okubo et al. | |
| 2006/0243049 A1 | 11/2006 | Ohta et al. | |
| 2006/0274399 A1 | 12/2006 | Yang | |
| 2007/0132733 A1 | 6/2007 | Ram | |
| 2007/0152976 A1 | 7/2007 | Townsend et al. | |
| 2007/0181962 A1 | 8/2007 | Partridge et al. | |
| 2007/0200564 A1 | 8/2007 | Motz et al. | |
| 2007/0281379 A1 | 12/2007 | Stark et al. | |
| 2008/0014682 A1 | 1/2008 | Yang et al. | |
| 2008/0066547 A1 | 3/2008 | Tanaka et al. | |
| 2008/0110259 A1 | 5/2008 | Takeno | |
| 2008/0119000 A1 | 5/2008 | Yeh et al. | |
| 2008/0123242 A1 | 5/2008 | Zhou | |
| 2008/0210007 A1 | 9/2008 | Yamaji et al. | |
| 2008/0211043 A1 | 9/2008 | Chen | |
| 2008/0211113 A1 | 9/2008 | Chua et al. | |
| 2008/0277747 A1 | 11/2008 | Ahmad | |
| 2008/0283991 A1 | 11/2008 | Reinert | |
| 2009/0007661 A1 | 1/2009 | Nasiri et al. | |
| 2009/0049911 A1 | 2/2009 | Fukuda et al. | |
| 2009/0108440 A1 | 4/2009 | Meyer et al. | |
| 2009/0115412 A1 | 5/2009 | Fuse | |
| 2009/0153500 A1 | 6/2009 | Cho et al. | |
| 2009/0262074 A1 | 10/2009 | Nasiri et al. | |
| 2009/0267906 A1 | 10/2009 | Schroderus | |
| 2009/0321510 A1 | 12/2009 | Day et al. | |
| 2010/0044121 A1 | 2/2010 | Simon et al. | |
| 2010/0071467 A1 | 3/2010 | Nasiri et al. | |
| 2010/0075481 A1 | 3/2010 | Yang | |
| 2010/0083756 A1 | 4/2010 | Merz et al. | |
| 2010/0109102 A1 | 5/2010 | Chen et al. | |
| 2010/0208118 A1 | 8/2010 | Ueyama | |
| 2010/0236327 A1 | 9/2010 | Mao | |
| 2010/0248662 A1 | 9/2010 | Sheynblat et al. | |
| 2010/0260388 A1 | 10/2010 | Garrett et al. | |
| 2010/0302199 A1 | 12/2010 | Taylor et al. | |
| 2010/0306117 A1 | 12/2010 | Terayoko | |
| 2010/0307016 A1 | 12/2010 | Mayor et al. | |
| 2010/0312519 A1 | 12/2010 | Huang et al. | |
| 2011/0131825 A1 | 6/2011 | Mayor et al. | |
| 2011/0146401 A1 | 6/2011 | Inaguma et al. | |
| 2011/0154905 A1 | 6/2011 | Hsu | |
| 2011/0172918 A1 | 7/2011 | Tome | |
| 2011/0183456 A1 | 7/2011 | Hsieh et al. | |
| 2011/0198395 A1 | 8/2011 | Chen | |
| 2011/0265574 A1 | 11/2011 | Yang | |
| 2011/0266340 A9 | 11/2011 | Block et al. | |
| 2011/0312349 A1 | 12/2011 | Forutanpour et al. | |
| 2012/0007597 A1 | 1/2012 | Seeger et al. | |
| 2012/0007598 A1 | 1/2012 | Lo et al. | |
| 2012/0215475 A1 | 8/2012 | Rutledge et al. | |

* cited by examiner

OXIDE RETAINER METHOD FOR MEMS DEVICES

BACKGROUND OF THE INVENTION

The present invention relates generally to integrated devices. More particularly, the present invention provides a method for fabricating a monolithically integrated MEMS device using release supports. More specifically, the present invention provides a method for forming release structures underlying a free standing MEMS structure and releasing the MEMS structure via an etching process. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to integrated devices and systems are provided. More particularly, the present invention provides a method for fabricating an integrated MEMS device using release supports. More specifically, the present invention provides a method for forming at least one MEMS device overlying patterned support structures and releasing the MEMS device(s) by vapor etching the patterned support structures. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

In a specific embodiment, embodiments of the present invention provides a method for fabricating a monolithic integrated MEMS device using release supports. The method includes providing a substrate having a surface region and forming at least one conduction material and at least one insulation material overlying at least one portion of the surface region. At least one support structure can be formed overlying at least one portion of the conduction and insulation surface regions, and at least one MEMS device can be formed overlying the support structure(s) and the conduction and insulation surface regions. In a variety of embodiments, the support structure(s) can include dielectric or oxide materials. The support structure(s) can then be removed and a cover material can be formed overlying the MEMS device(s), the conduction and insulation materials, and the substrate. In various embodiments, the removal of the support structure(s) can be accomplished via a vapor etching process.

Many benefits are achieved by way of the present invention over conventional techniques. For example, the present technique provides an easy to use process that relies upon conventional technology. In various embodiments, the method can protect against damage reduce stiction, the process of a MEMS device becoming struck together during a releasing process. The releasing process, which can include performing a vapor etching process, can also be more effective due to the reaction proceeding quickly and not being diffusion limited when applied to a high aspect ratio structure. The method provides a process and system that are compatible with conventional process technology without substantial modifications to conventional equipment and processes. Preferably, the invention provides for an improved MEMS device system and related applications for a variety of uses. In one or more embodiments, the present invention provides for all MEMS and related applications, which may be integrated on one or more integrated circuit device structures. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow

BRIEF DESCRIPTION OF THE DRAWINGS

The diagrams disclosed in the present patent application are merely implementation examples, which should not unduly limit the scope of the claims herein. It should be understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

According to the present invention, techniques related generally to integrated devices and systems are provided. More particularly, the present invention provides a method for fabricating an integrated MEMS device using release supports. More specifically, the present invention provides a method for forming at least one MEMS device overlying patterned support structures and releasing the MEMS device(s) by vapor etching the patterned support structures.

Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1:
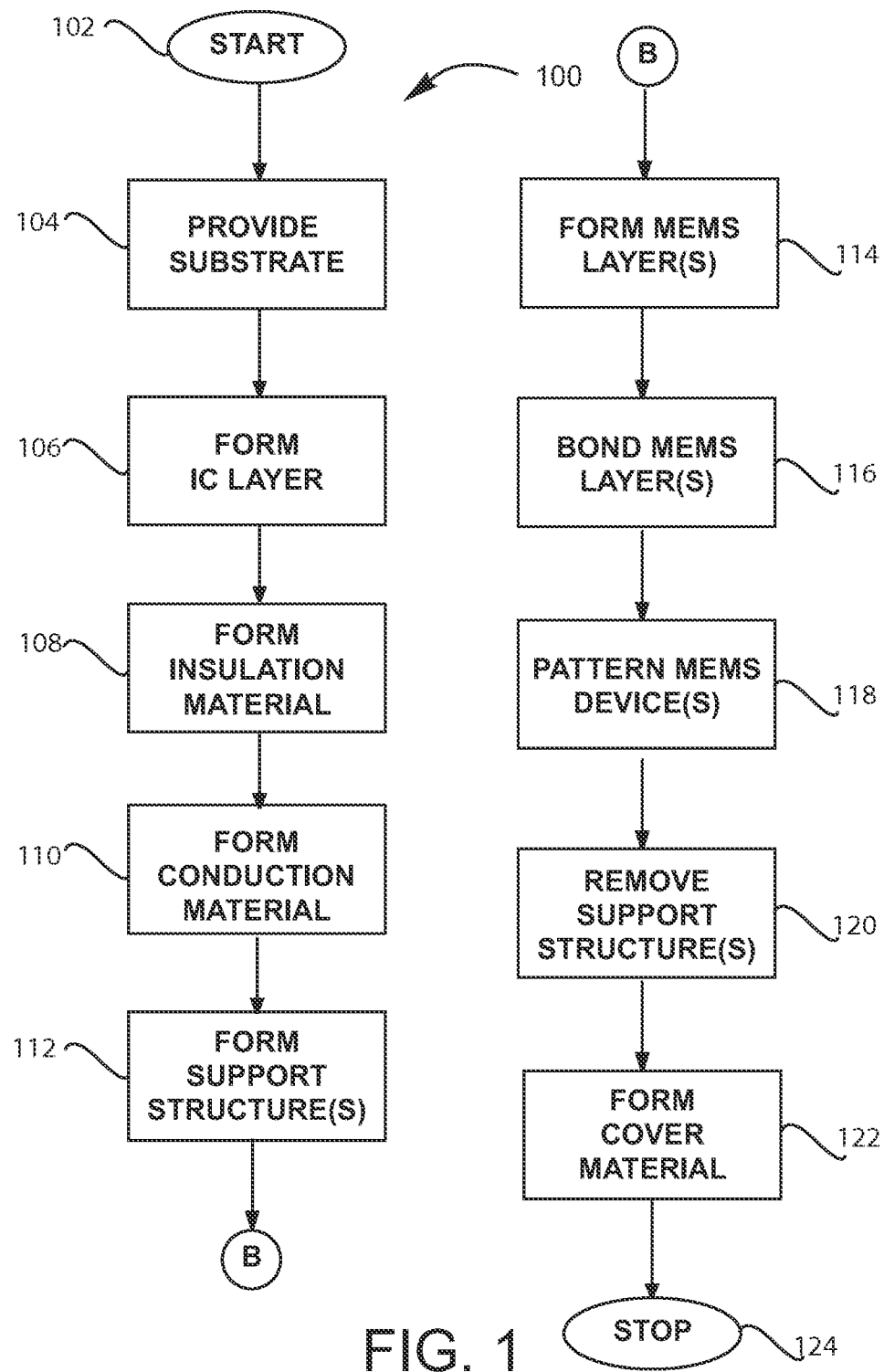
FIG. 1 is a simplified flow diagram of a method for fabricating an integrated MEMS device according to an embodiment of the present invention.

FIG. 1 is a simplified flow diagram illustrating a method of fabricating an integrated MEMS device using release supports according to an embodiment of the present invention. This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 1, the present method can be briefly outlined below.

1. Start;
2. Provide a substrate;
3. Form an integrated circuit (IC) layer overlying the substrate;
4. Form at least one insulation material overlying the IC layer;
5. Form at least one conduction material overlying the IC layer;
6. Form at least one support structure overlying the insulation material(s) and the conduction material(s);
7. Form at least one MEMS layer overlying the insulation material(s), the conduction material(s), and the support structure(s);
8. Bond the MEMS layer(s) to at least one portion of the insulation material(s);
9. Pattern the MEMS layer(s) to form at least one MEMS device;
10. Remove the support structure(s);
11. Form a cover material overlying the MEMS device(s), the insulation material(s), the conduction material(s), and the substrate; and
12. Stop;

These steps are merely examples and should not unduly limit the scope of the claims herein. As shown, the above method provides a way of fabricating an integrated MEMS device using release supports according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 1, method 100 begins at start, step 102. The present method provides a fabrication method for forming an integrated MEMS device using release supports. Many benefits are achieved by way of the present invention over conventional techniques. For example, the present technique provides an easy to use process that relies upon conventional technology. In various embodiments, the method can protect against damage reduce stiction, the process of a MEMS device becoming struck together during a releasing process. The releasing process, which can include performing a vapor etching process, can also be more effective due to the reaction proceeding quickly and not being diffusion limited when applied to a high aspect ratio structure. In some embodiments, the method provides higher device yields in dies per wafer with the integrated approach. Additionally, the method provides a process and system that are compatible with conventional process technology without substantial modifications to conventional equipment and processes. Preferably, the invention provides for an improved integrated MEMS and integrated circuit device and related methods for a variety of uses. Depending upon the embodiment, one or more of these benefits may be achieved. These and other benefits will be described in more throughout the present specification and more particularly below.

Following step 102, fabrication method 100 involves providing a substrate having a surface region, step 104. In an embodiment, the substrate can include a buried oxide (BOX) layer. In a specific embodiment, the substrate can include an epitaxial (EPI) layer. The substrate can also be a silicon substrate. In further embodiments, the substrate can include a silicon, single crystal silicon, or polycrystalline silicon material. The substrate can also be a substrate-on-insulator or the substrate can have micro lead-frame packaging (MLP) materials, wafer level packaging (WLP) materials, or chip scale packaging (CSP) materials. Those skilled in the art will recognize other variations, modifications, and alternatives.

An integrated circuit (IC) layer can be formed overlying at least one portion of the surface region, step 106. The IC layer can have an IC surface region. In a specific embodiment, the IC layer can be a CMOS layer having a CMOS surface region. The CMOS layer can include one or more CMOS IC devices, which can be formed overlying the substrate. In further embodiments, additional transistors, metal layers, and structures can be added. The fabrication of the one or more CMOS IC devices can be done through foundry-compatible processes. Of course, there can be other variations, modifications, and alternatives.

Following the formation of IC layer, at least one insulation material can be formed overlying at least one portion of the surface region, step 108. In an embodiment, the insulation material(s) can include dielectric material(s), such as a silicon dioxide material, or oxide material, or other material and combination thereof. The dielectric material(s) can have one or more patterned regions. In a specific embodiment, the insulation material(s) can include a first dielectric material and can be formed overlying at least one portion the IC surface region. At least one conduction material can be formed overlying at least one portion of the surface region, step 110. In various embodiments, the conduction material(s) can be formed overlying at least one portion of the IC surface region. The conduction material(s) can include a metal, metal alloy, or other conductive material or combination thereof. In a specific embodiment, the conduction material(s) can include metal layers coupled to one or more portions of the IC layer. As stated previously, there can be other variations, modifications, and alternatives.

After forming the insulation and conduction materials, at least one support structure can be formed overlying at least one portion of the conduction can insulation surface regions, step 112. In an embodiment, the forming of the support structure(s) can include forming a second dielectric material overlying the insulation and conduction surface regions and removing at least a portion of the second dielectric material. The support structure(s) can be patterned from the second dielectric material via a wet etching, dry etching, or mechanical process. The second dielectric material can include an oxide, silicon dioxide, or other material and combination thereof. In various embodiments, the support structure(s) can include oxide retainer(s), small patterned support(s), or bond support(s). Of course, there can be other variations, modifications, and alternatives.

At least one MEMS device can then be formed overlying at least one portion of the conduction and insulation surface regions, as well as the support structure(s). In an embodiment, the formation of the MEMS device(s) can begin with the formation of at least one MEMS layer, step 114. The MEMS layer can include silicon, metals, dielectrics, and other materials and combinations thereof. The MEMS layer can then be bonded to at least one portion of the dielectric material(s), step 116. Once the MEMS layer(s) are bonded, the MEMS layer(s) can be patterned to form MEMS device(s), step 118. The MEMS device(s) can be formed by a wet etching, dry etching, or mechanical process. In various embodiments, the MEMS device(s) can include MEMS sensor(s), MEMS actuator(s), or other MEMS structure (s) and combinations thereof. The MEMS device(s) can be supported by the support structure(s) to protect against undesirable stress during wafer bonding or other fabrication processes. One or more via structures can also be formed to coupled the MEMS device(s) to the conduction material(s) or the IC layer. Again, there can be other variations, modifications, and alternatives.

Once the MEMS device(s) are fully bonded and patterned, the support structure(s) can be removed, step 120. The removal of the support structure(s) would cause the MEMS device(s) to be free standing. In a specific embodiment, the support structure(s) can be sized and spatially configured to increase the speed of removing the support structure(s). The removal process of the support structure(s) can also be improved to not be diffusion limited when applied to high aspect ratio structures. In further embodiments, the support structure(s) can be sized and spatially configured to reduce stiction, the process of the MEMS device(s) becoming stuck during a releasing process. The removing of the support structure(s) can include performing a wet etching, dry etching, or mechanical process. In a specific embodiment, the etching process can include a Hydrogen Fluoride (HF) vapor etching process. Those skilled in the art will recognize other variations, modifications, and alternatives.

Once the support structure(s) have been removed, a cover material can be formed overlying at least one portion of the conduction and insulation surface regions, and at least on portion of the substrate, step 122. In various embodiments, the cover material can include micro lead-frame packaging (MLP) material, wafer level packaging (WLP) material, chip scale packaging (CSP) material, or other materials and combinations thereof. Of course, there can be other variations, modifications, and alternatives.

The above sequence of processes provides a fabrication method for forming an integrated MEMS device according to an embodiment of the present invention. As shown, the method uses a combination of steps including providing a substrate, forming support structure(s) overlying insulation and conduction materials over an IC layer, forming MEMS device(s) overlying the support structures, removing the support structures, and forming a cover. Other alternatives can also be provided where steps are added, one or more steps are removed, or one or more steps are provided in a different sequence without departing from the scope of the claims herein. Further details of the present method can be found throughout the present specification.

Figure 2:
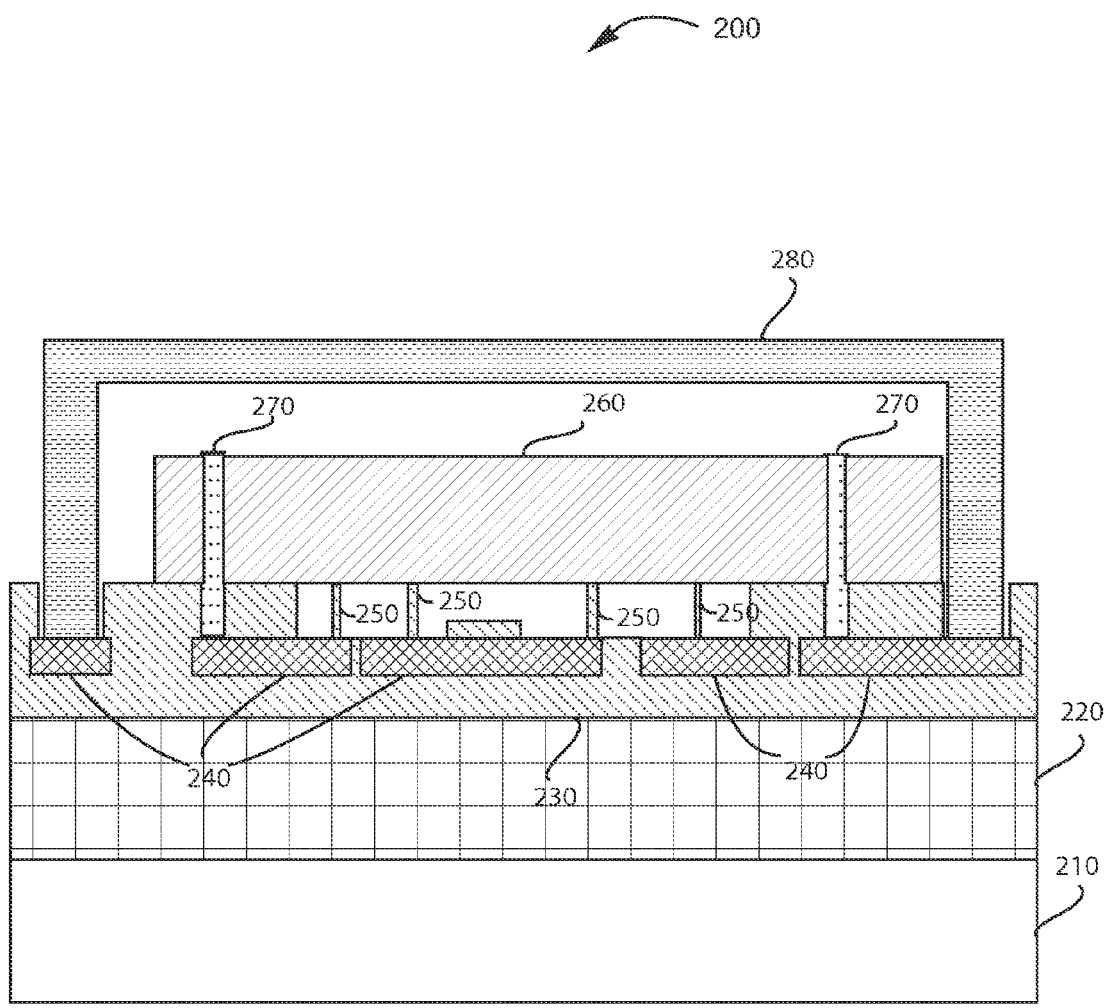
FIG. 2 is a simplified cross-section diagram of an integrated MEMS device according to an embodiment of the present invention.

FIG. 2 is a simplified cross section diagram of a monolithically integrated MEMS device according to an embodiment of the present invention. This figure can represent the method described in FIG. 1 during an intermediate stage of forming the MEMS device(s). As shown in FIG. 2, device 200 can include a substrate 210, an IC layer 220, at least one insulation material 230, at least one conduction material 240, at least one support structure 250, at least one MEMS device 260, and cover material 280. Those of ordinary skill in the art will recognize other variations, alternatives, and modifications.

In an embodiment, substrate 210 can include a buried oxide (BOX) layer. In a specific embodiment, substrate 210 can include an epitaxial (EPI) layer. Substrate 210 can also be a silicon substrate. In further embodiments, substrate 210 can include a silicon, single crystal silicon, or polycrystalline silicon material. Substrate 210 can also be a substrate-on-insulator or substrate 210 can have micro lead-frame packaging (MLP) materials, wafer level packaging (WLP) materials, or chip scale packaging (CSP) materials. Those skilled in the art will recognize other variations, modifications, and alternatives.

Integrated circuit (IC) layer 220 can be formed overlying at least one portion of the surface region. IC layer 220 can have an IC surface region. In a specific embodiment, IC layer 220 can be a CMOS layer having a CMOS surface region. The CMOS layer can include one or more CMOS IC devices, which can be formed overlying the substrate. In further embodiments, additional transistors, metal layers, and structures can be added. The fabrication of the one or more CMOS IC devices can be done through foundry-compatible processes. Of course, there can be other variations, modifications, and alternatives.

In an embodiment, insulation material(s) 230 can include dielectric material(s), such as a silicon dioxide material, or oxide material, or other material and combination thereof. The dielectric material(s) can have one or more patterned regions. In a specific embodiment, insulation material(s) 230 can include a first dielectric material and can be formed overlying at least one portion the IC surface region. In various embodiments, conduction material(s) 240 can be formed overlying at least one portion of the IC surface region. Conduction material(s) 240 can include a metal, metal alloy, or other conductive material or combination thereof. In a specific embodiment, conduction material(s) 240 can include metal layers coupled to one or more portions of IC layer 220. As stated previously, there can be other variations, modifications, and alternatives.

In an embodiment, a method for forming support structure(s) 250 can include forming a second dielectric material overlying the insulation and conduction surface regions and removing at least a portion of the second dielectric material. Support structure(s) 250 can be patterned from the second dielectric material via a wet etching, dry etching, or mechanical process. The second dielectric material can include an oxide, silicon dioxide, or other material and combination thereof. In various embodiments, support structure(s) 250 can include oxide retainer(s), small patterned support(s), or bond support(s). Of course, there can be other variations, modifications, and alternatives.

In an embodiment, the MEMS device(s) can be formed overlying at least one portion of the conduction and insulation surface regions, as well as the support structure(s). In an embodiment, the formation of the MEMS device(s) can begin with the formation of at least one MEMS layer 260. MEMS layer(s) 260 can include silicon, metals, dielectrics, and other materials and combinations thereof. MEMS layer(s) 260 can then be bonded to at least one portion of dielectric material(s) 230. Once MEMS layer(s) 260 are bonded, MEMS layer(s) 260 can be patterned to form MEMS device(s). In a specific embodiment, the MEMS device(s) can be formed by a wet etching, dry etching, or mechanical process. In various embodiments, the MEMS device(s) can include MEMS sensor(s), MEMS actuator(s), or other MEMS structure (s) and combinations thereof. The MEMS device(s) can be supported by the support structure(s) to protect against undesirable stress during wafer bonding or other fabrication processes. One or more via structures 270 can also be formed to coupled the MEMS device(s) to the conduction material(s) or the IC layer. Again, there can be other variations, modifications, and alternatives.

In various embodiments, cover material 280 can include micro lead-frame packaging (MLP) material, wafer level packaging (WLP) material, chip scale packaging (CSP) material, or other materials and combinations thereof. Of course, there can be other variations, modifications, and alternatives.

Figure 3:
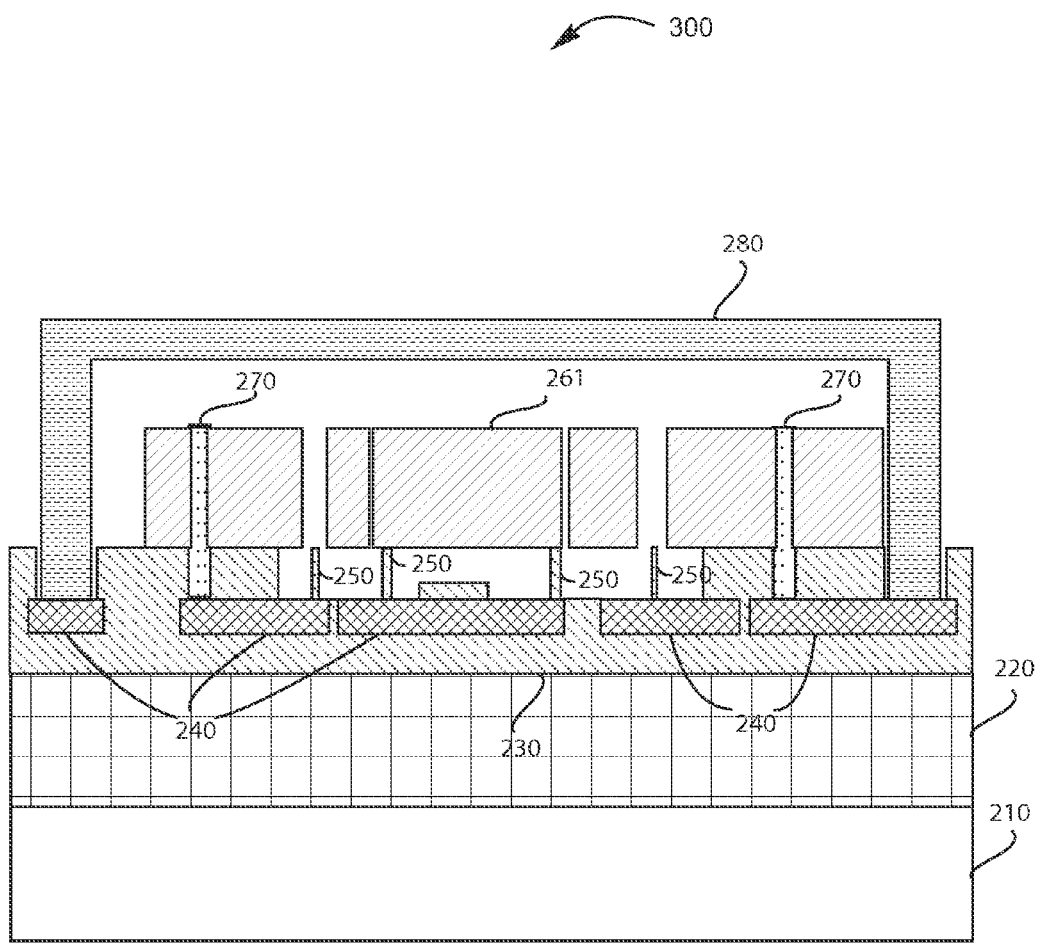
FIG. 3 is a simplified cross-section diagram of an integrated MEMS device according to an embodiment of the present invention.

FIG. 3 is a simplified cross section diagram of a monolithically integrated MEMS device according to an embodiment of the present invention. This figure can represent the method described in FIG. 1 during the formation of the MEMS device(s). Compared with FIG. 2, the MEMS device(s) shown are fully patterned. As shown in FIG. 3, device 300 can include a substrate 210, an IC layer 220, at least one insulation material 230, at least one conduction material 240, at least one support structure 250, at least one (fully formed) MEMS device 261, and cover material 280. A detailed description regarding the structure and the elements of device 300 can be found above in the description for FIG. 2. Of course, those of ordinary skill in the art will recognize other variations, alternatives, and modifications.

Figure 4:
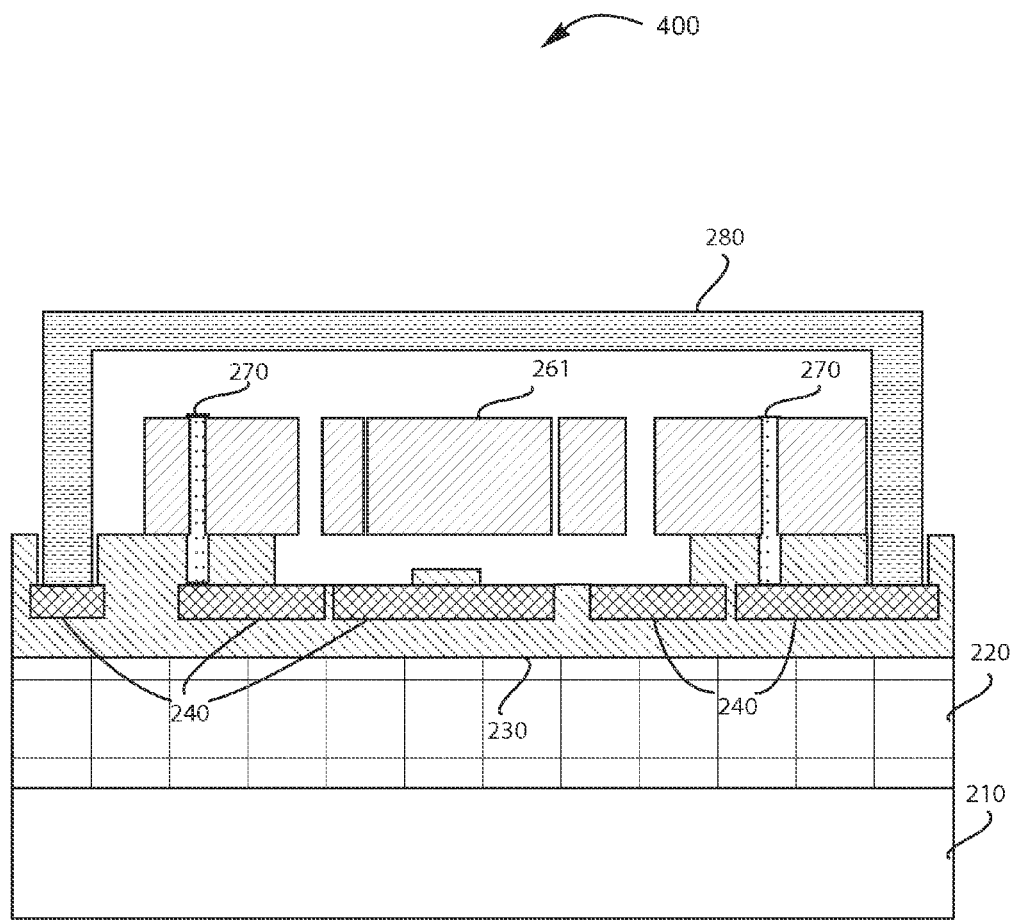
FIG. 4 is a simplified cross-section diagram of an integrated MEMS device according to an embodiment of the present invention.

FIG. 4 is a simplified cross section diagram of a monolithically integrated MEMS device according to an embodiment of the present invention. This figure can represent the method described in FIG. 1 after removing the support structure(s). Compared to FIG. 3, the support structure(s) have been removed via an HF vapor etching process. As shown in FIG. 4, device 400 can include a substrate 210, an IC layer 220, at least one insulation material 230, at least one conduction material 240, at least one support structure 250, at least one (fully formed) MEMS device 261, and cover material 280. A detailed description regarding the structure and the elements of device 400 can be found above in the description for FIG. 2. Of course, those of ordinary skill in the art will recognize other variations, alternatives, and modifications.

It is also understood that the examples and embodiments described herein are for illustrative purposes only and that various modifications or changes in light thereof will be suggested to persons skilled in the art and are to be included within the spirit and purview of this application and scope of the appended claims.

Figure 5:
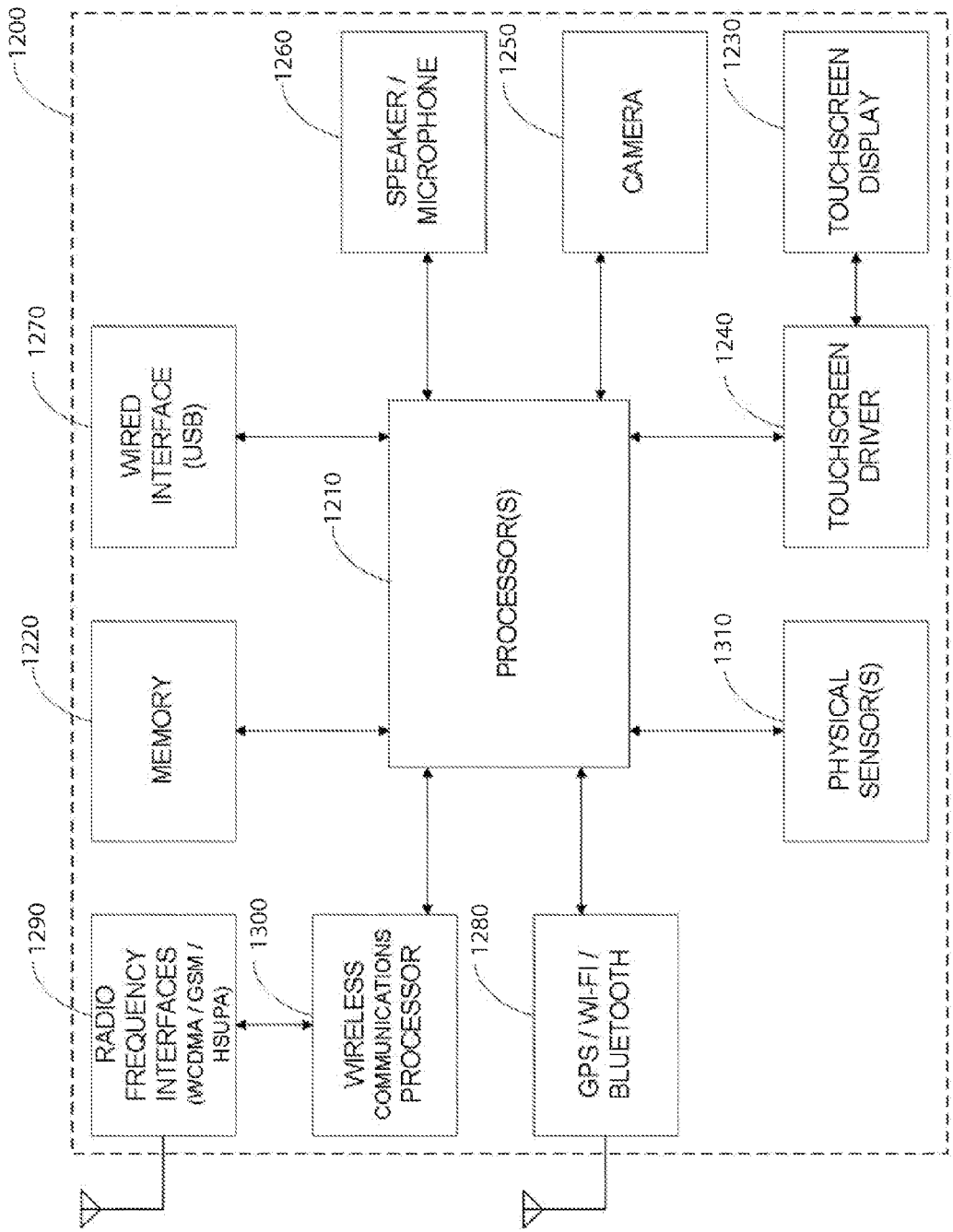
FIG. 5 illustrates a functional block diagram of various embodiments of the present invention.

FIG. 5 illustrates a functional block diagram of various embodiments of the present invention. In FIG. 5, a computing device 1200 typically includes an applications processor 1210, memory 1220, a touch screen display 1230 and driver 1240, an image acquisition device 1250, audio input/output devices 1260, and the like. Additional communications from and to computing device are typically provided by via a wired interface 1270, a GPS/Wi-Fi/Bluetooth interface 1280, RF interfaces 1290 and driver 1300, and the like. Also included in various embodiments are physical sensors 1310.

In various embodiments, computing device 1200 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 1200 may include one or more processors 1210. Such processors 1210 may also be termed application processors, and may include a processor core, a video/graphics core, and other cores. Processors 1210 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 1220 may include different types of memory (including memory controllers), such as flash memory (e.g. NOR, NAND), pseudo SRAM, DDR SDRAM, or the like. Memory 1220 may be fixed within computing device 1200 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 1230 and driver 1240 may be based upon a variety of later-developed or current touch screen technology including resistive displays, capacitive displays, optical sensor displays, electromagnetic resonance, or the like. Additionally, touch screen display 1230 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 1250 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 1260 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 1210 to enable the user to operate computing device 1200 by stating voice commands. Additionally, a speech engine may be provided in various embodiments to enable computing device 1100 to provide audio status messages, audio response messages, or the like.

In various embodiments, wired interface 1270 may be used to provide data transfers between computing device 1200 and an external source, such as a computer, a remote server, a storage network, another computing device 1200, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 1280 may also be provided to provide wireless data transfers between computing device 1200 and external sources, such as computers, storage networks, headphones, microphones, cameras, or the like. As illustrated in FIG. 6, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 5, GPS functionality is included as part of wireless interface 1280 merely for sake of convenience, although in implementation, such functionality is currently performed by circuitry that is distinct from the Wi-Fi circuitry and distinct from the Bluetooth circuitry.

Additional wireless communications may be provided via RF interfaces 1290 and drivers 1300 in various embodiments. In various embodiments, RF interfaces 1290 may support any future-developed or conventional radio frequency communications protocol, such as CDMA-based protocols (e.g. WCDMA), GSM-based protocols, HSUPA-based protocols, or the like. In the embodiments illustrated, driver 1300 is illustrated as being distinct from applications processor 1210. However, in some embodiments, these functionality are provided upon a single IC package, for example the Marvel PXA330 processor, and the like. It is contemplated that some embodiments of computing device 1200 need not include the RF functionality provided by RF interface 1290 and driver 1300.

FIG. 5 also illustrates computing device 1200 to include physical sensors 1310. In various embodiments of the present invention, physical sensors 1310 can be single axis or multi-axis Micro-Electro-Mechanical Systems (MEMS) based devices being developed by M-cube, the assignee of the present patent application. Physical sensors 1310 can include accelerometers, gyroscopes, pressure sensors, magnetic field sensors, bio sensors, and the like. In some embodiments, physical sensors 1310 can be formed using the methods described above in connection with FIGS. 1-4. In other embodiments of the present invention, conventional physical sensors 1310 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 1230 and driver 1240 and inputs/or outputs to physical sensors 1310 may be processed in parallel processing threads. In other embodiments, such events or outputs may be processed serially, or the like. Inputs and outputs from other functional blocks may also be processed in parallel or serially, in other embodiments of the present invention, such as image acquisition device 1250 and physical sensors 1310.

FIG. 5 is representative of one computing device 1200 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 5. For example, in various embodiments, computing device 1200 may lack image acquisition unit 1250, or RF interface 1290 and/or driver 1300, or GPS capability, or the like. Additional functions may also be added to various embodiments of computing device 1200, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a monolithically integrated MEMS device, the method comprising:
   providing a substrate having a surface region;
   forming at least one insulation material overlying at least one portion of the surface region, the insulation material having an insulation surface region;

forming at least one conduction material overlying the at least one portion of the surface region, the conduction material having a conduction surface region;

forming multiple oxide retainers, each oxide retainer including a patterned small support structure overlying at least one portion of the conduction and insulation surface regions;

forming at least one MEMS device overlying at least one portion of the conduction and insulation surface regions, the MEMS device(s) overlying the oxide retainers, the oxide retainers being configured to support the MEMS device and to reduce stiction;

removing the oxide retainers, the oxide retainers being configured to reduce diffusion limitation of the removal process; and forming a cover material overlying the MEMS device, at least one portion of the conduction and insulation materials, and at least one portion of the substrate.

2. The method of claim 1 further comprising forming an integrated circuit (IC) layer overlying at least one portion of the surface region, the IC layer having an IC surface region.

3. The method of claim 2 wherein the insulation and conduction material(s) are formed overlying at least one portion of the IC surface region.

4. The method of claim 1 wherein the insulation material comprises a first dielectric material.

5. The method of claim 4 wherein the forming of the support structure(s) comprises forming a second dielectric material overlying the insulation and conduction surface regions and removing at least a portion of the second dielectric material.

6. The method of claim 5 wherein the second dielectric material comprises an oxide material or a silicon dioxide material.

7. The method of claim 1 wherein the support structure(s) comprise at least one oxide retainer, small patterned support, or bond support.

8. The method of claim 1 wherein the MEMS device(s) comprise at least one MEMS sensor, MEMS actuator, or MEMS structure.

9. The method of claim 1 wherein the removing of the support structure(s) comprises a wet etching, dry etching, or mechanical process.

10. The method of claim 1 wherein the removing of the support structure(s) comprises a Hydrogen Fluoride (HF) vapor etching process.

11. A method of fabricating a monolithically integrated MEMS device, the method comprising:

providing a substrate having a surface region;

forming an integrated circuit (IC) layer overlying at least one portion of the surface region, the IC layer having an IC surface region;

forming at least one first dielectric material overlying at least one portion of the IC surface region and the surface region, the first dielectric material having a first dielectric surface region;

forming at least one metal material overlying at least one portion of the IC surface region and the surface region, the metal material(s) having a conduction surface region;

forming multiple oxide retainers, each oxide retainer including a patterned small support structure overlying at least one portion of the conduction and first dielectric surface regions;

forming at least one MEMS device overlying at least one portion of the conduction and first dielectric surface regions, the MEMS device(s) having a high aspect ratio and being configured overlying the oxide retainers, the oxide retainers being configured to support the MEMS device and to reduce stiction;

removing the oxide retainers, the oxide retainers being configured to reduce diffusion limitation of the removal process, the removal process including a Hydrogen Fluoride (HF) vapor etching process; and forming a cover material overlying the MEMS device, at least one portion of the conduction and first dielectric surface regions, and at least one portion of the IC surface region.

12. The method of claim 11 wherein the first dielectric material(s) and metal material(s) are formed overlying at least one portion of the IC surface region.

13. The method of claim 11 wherein the forming of the support structure(s) comprises forming a second dielectric material and removing at least a portion of the second dielectric material.

14. The method of claim 13 wherein the first and second dielectric materials comprise oxide materials or silicon dioxide materials.

15. The method of claim 11 wherein the support structure(s) comprise at least one oxide retainer, small patterned support, or bond support.

16. The method of claim 11 wherein the MEMS device(s) comprise at least one MEMS sensor, MEMS actuator, or MEMS structure.

17. The method of claim 11 wherein the MEMS device(s) are formed by a wet etching, dry etching, or mechanical process.

18. The method of claim 11 wherein the removing of the support structure(s) comprises a wet etching, dry etching, or mechanical process.

19. The method of claim 11 wherein the removing of the support structure(s) comprises a Hydrogen Fluoride (HF) vapor etching process.

20. A method for fabricating a monolithic integrated MEMS device, the method comprising:

forming multiple oxide retainers, each oxide retainer including a patterned small support structure overlying at least a portion of a first dielectric and metal surface region(s), the oxide retainers being formed from a dielectric material via an etching process, the oxide retainers being sized and spatially configured to allow for quick removal of the oxide retainers and to reduce stiction and to prevent the removal of the oxide retainers from being diffusion limited;

forming at least one MEMS device overlying at least one portion of the first dielectric and metal surface region(s), the MEMS device(s) having a high aspect ratio and being configured overlying the oxide retainers;

removing the oxide retainers via a Hydrogen Fluoride (HF) vapor etching process; and forming a cover material overlying the MEMS device(s), at least one portion of the metal and first dielectric surface regions, and at least one portion of the substrate.

* * * * *